United States Patent [19]

Krupp

[11] Patent Number: 4,680,542
[45] Date of Patent: Jul. 14, 1987

[54] LOGIC CIRCUIT TESTER

[76] Inventor: Gerald L. Krupp, 3214 Eighth Ave., Huntsville, Ala. 35805

[21] Appl. No.: 736,857

[22] Filed: May 22, 1985

[51] Int. Cl.⁴ .................. G01R 19/16; G01R 31/02
[52] U.S. Cl. .................................................. 324/133
[58] Field of Search ............... 324/73 PC, 73 R, 133; 340/752, 756

[56] References Cited

U.S. PATENT DOCUMENTS

| 3,628,141 | 12/1971 | Union | 324/133 |
| 3,903,471 | 9/1975 | Hiraga | 324/133 |
| 4,110,687 | 8/1978 | Sneed | 324/133 |
| 4,189,673 | 2/1980 | Shintaku | 324/133 |
| 4,321,543 | 3/1982 | Tuska | 324/133 |
| 4,573,007 | 2/1986 | Mefford | 324/133 |

FOREIGN PATENT DOCUMENTS 2110857 6/1983 United Kingdom ............... 340/752

Primary Examiner—Reinhard J. Eisenzopf
Assistant Examiner—Jose M. Solis
Attorney, Agent, or Firm—C. A. Phillips

[57] ABSTRACT

A logic circuit tester wherein high and low threshold signal states and transitions through them are detected. The presence or absence of any of these four states is used to provide combinations of logic signals to an L.E.D. dot matrix display unit encoded to respond with a series of 11 patterns, each of which is illustrative of a circuit state likely to be encountered.

7 Claims, 3 Drawing Figures

U.S. Patent  Jul. 14, 1987  Sheet 3 of 3  4,680,542
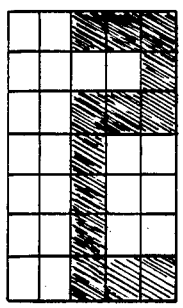
c
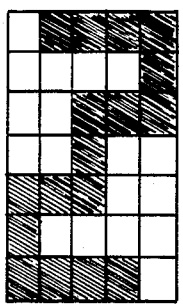
f
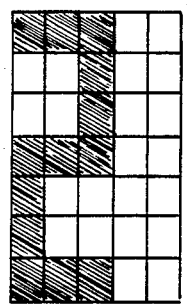
i
FIG. 3
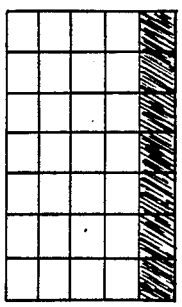
b
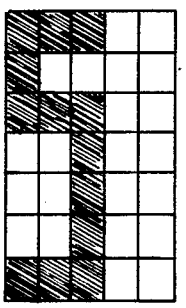
e
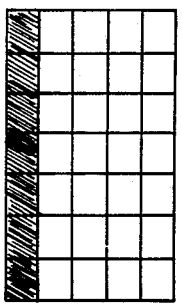
h
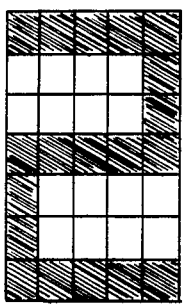
k
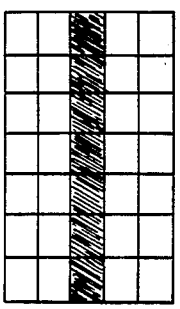
a
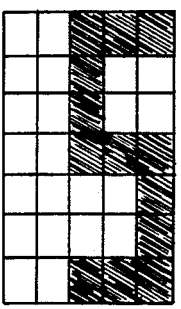
d
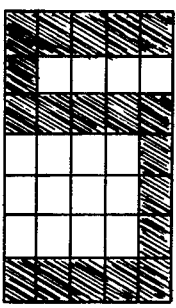
g
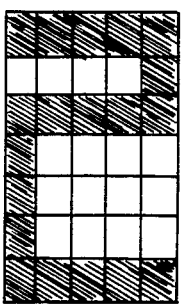
j

LOGIC CIRCUIT TESTER

FIELD OF THE INVENTION

This invention relates generally to devices for the pictorial presentations of electrical waveforms and particularly to a device which provides a pictorial representation of the condition of logic signals.

DISCUSSION OF PRIOR ART

The troubleshooting of electronic circuitry is largely performed by instruments which either indicate numerically the electrical state at a point in a circuit or display a replica of that condition on a screen, usually a screen of an oscilloscope. With the coming of the digital electronics explosion, there has been an increased need for the pictorial type readout or display as being the most informative of the state of the digital signal. It was thus expected that oscilloscopes would be widely employed in this regard, and they have been. The disadvantage of oscilloscopes is that they are large and expensive and often require involved set-up procedures, including a provision for triggering pulses and synchronization of the digital pulse trains being observed and the internal sweep frequency of the oscilloscope. Other disadvantages, such as the establishment of D.C. thresholds and the difficulty of observing single pulses, unless a special storage oscilloscope is used, present very real problems. Because of one or more of these problems, a new class of device has been developed which is generally referred to as a logic probe. It varies in complexity and a variety of outputs but in general employs several light emitting diodes where the illumination of particular diodes illustrates a particular electrical state of the measured point, such as a high state, a low state, or a state that is periodically changing from low to high. Such presentations are often inadequate to enable one to readily understand the electrical state at the point of examination.

It is the object of the present invention to provide an instrument which provides a group of different waveform patterns which is essentially self-explanatory of the electrical state of the point in the circuit being examined.

SUMMARY OF THE INVENTION

In accordance with this invention, an essentially pen-size unit with a probe on one end houses analysis circuitry, and this circuitry drives an LED dot matrix display which is viewable to the user. Positive and negative power leads are employed to power the circuitry from the device under test and to provide a reference level for the measurement being made by the probe. First, the circuitry includes high and low threshold comparators to provide first and second discrete outputs, the first when the logic level rises above a critical logic level and the second when it is below a critical logic level. The resulting outputs thus indicate the presence of high and low levels. In addition, each of these levels is detected for change, and thus two additional outputs are provided indicating the presence of a rising pulse and a falling pulse. These four outputs are then treated as logic signals, and the variability of their combination is employed to generate a series of waveforms illustrative of the state of the signal under test.

BRIEF DESCRIPTION OF THE DRAWINGS

FIG. 3 contains 11 tables, Tables a-k, illustrating discrete waveforms indicative of measured circuit conditions.

DESCRIPTION OF THE PREFERRED EMBODIMENT

Figure 1:
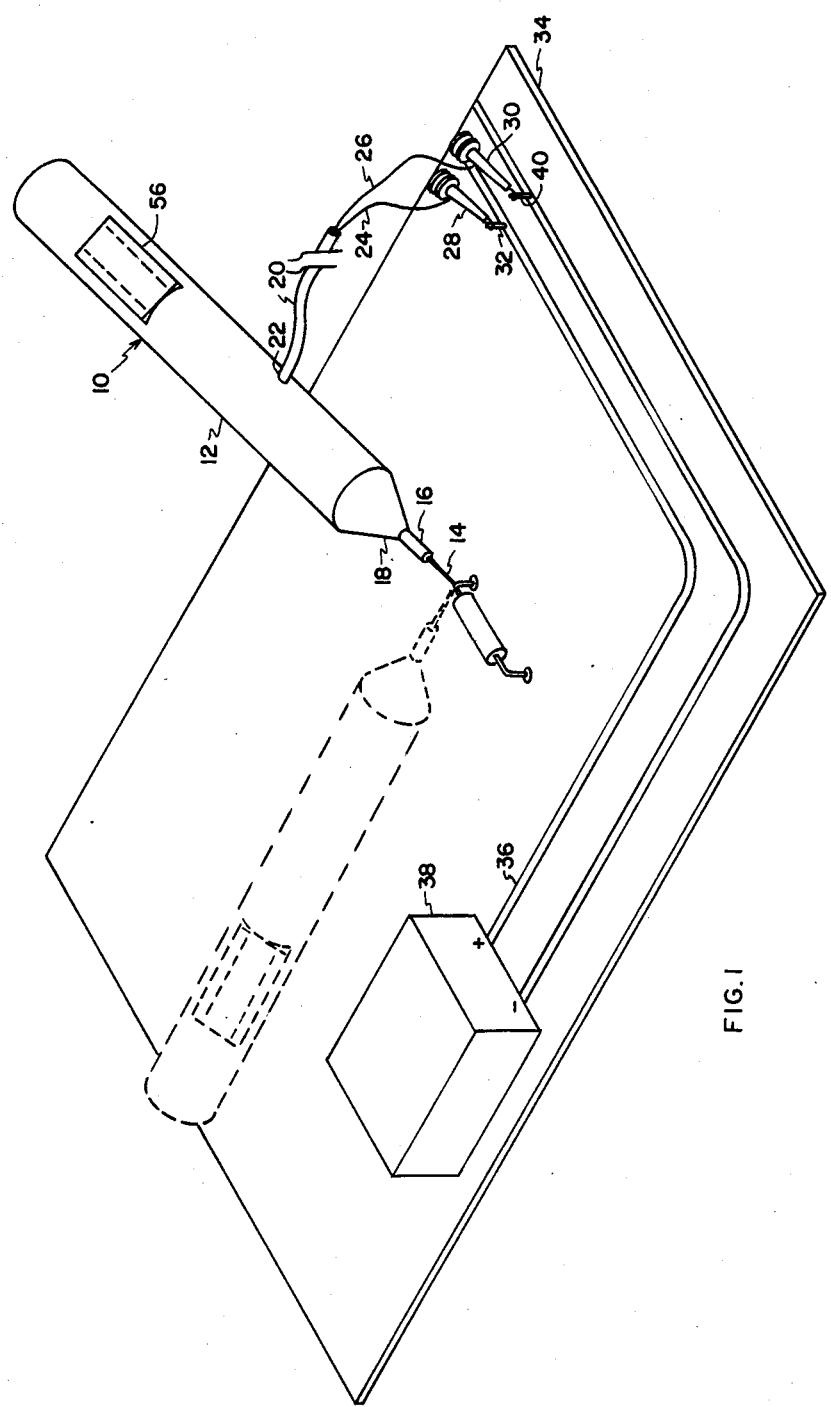
FIG. 1 is a pictorial illustration showing an embodiment of the invention in use.
Figure 2:
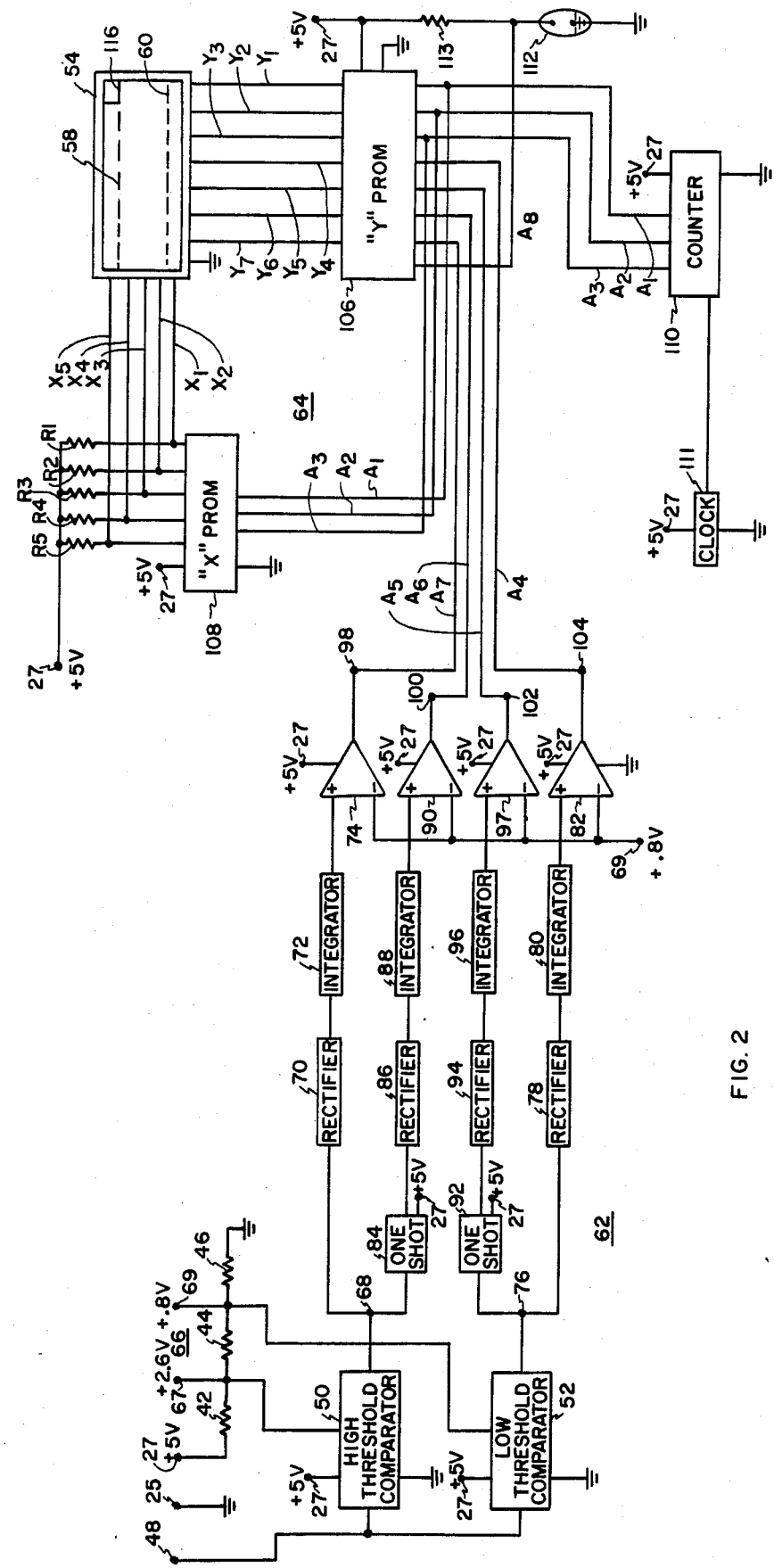
FIG. 2 is an electrical diagram, partly in block form and partly in schematic form, of an embodiment of the invention.

Referring to FIG. 1, logic analyzer 10 employs a tubular housing 12 in which there is enclosed an electrical circuit board on which are mounted the components forming the electronic assembly illustrated in FIG. 2. An electrically conductive tip 14 extends through an insulating sleeve 16 from end 18 of housing 12 and provides a test electrical input. Typically, tip 14 would be spring loaded to absorb shock (by means not shown). The analyzer is powereed through a cable 20 extending through an opening 22 in housing 12, and it includes two electrical conductors or leads 24 and 26. Leads 24 and 26 are connected to ball clip-type connectors 28 and 30, respectively. As illustrated, connector 28, and thus lead 24, is connected to a conductor 32 which is connected to a positive terminal 36 of power supply 38 supplying power to a printed circuit board 34. Connector 30, and thus lead 26, is connected to a conductor 40 connected to the minus terminal of power supply 38. Lead 26 connects to terminal 27 (FIG. 2) and provides a +5 volts for operation of the circuitry of the tester. Lead 24 is connected to terminal 27 in FIG. 2 to provide a negative or ground return to complete the input power circuit. A voltage divider 66 consisting of resistors 42, 44, and 46 connected between terminal 27 and ground provide, as shown, +2.6 volts at terminal 67 and +0.8 at terminal 69 as reference potentials in the circuit.

Probe or probe tip 14 is connected to input terminal 48 (FIG. 2) and from it to the inputs of high threshold comparator 50 and low threshold comparator 52.

Referring generally to FIG. 2, a readout or display for tester 10 is provided by display 54, positioned within housing 12 and viewable through an opening 56 in housing 12. Display 54 is a 5×7 matrix of light emitting diodes (L.E.D.s), there thus being five lines and seven columns of the light emitting diodes. By individual powering of these light emitting diodes as a function of the signal in a circuit being observed, distinctive light patterns are generated which are readily appreciated as being indicative of the signal state of that signal. As an aid in the analysis of the patterns that appear, two threshold signal values are used as references, one is 2.6 volts and the other is 0.8 volt, and the dashed lines 58 and 60 on the face of display 54 divide the display in terms of these thresholds. The top dashed line 58 always represents the 2.6 vǫlt threshold, and the lower line 60 represents the 0.8 volt threshold regardless of the orientation of tester 10. This is accomplished by a position sensor which switches certain circuitry to invert patterns upon the analyzer being oriented to the dashed line position, shown in FIG. 1.

Tester 10 may be functionally divided into signal processor 62 and display circuitry 64. First, with respect to signal processor 62, its function is to devleop from the input signal from probe tip 14 appearing at terminal 48 four discrete high-low logic signals, each of which describes a distinctive feature of the signal being monitored. The first step in developing the first of these is accomplished by high threshold comparator 50 to which the signal input is applied together with the +2.6 volts from voltage divider 66. This comparator is conventional and simply provides as an output on terminal 68 an approximately +3.6 volts output when the input signal is greater than 2.6 volts and an approximately 0 volts output when it is not. This signal is fed through a rectifier 70 to integrator 72. Integrator 72, typically employing series resistance and parallel capacitance, has a time constant of approximately one-hundredth of a second. Thus, its output remains stable with a potential of approximately 1.1 volt, assuming that the signal under test remains above 2.6 volts for at least 50% of its cycle. Thus, for a square wave input to high threshold comparator 50, there typically would be provided as an output of high threshold comparator 50 a high state of approximately 3.6 volts for 50% of the time and 0 volts for 50% of the time; and then with an approximatley 0.7 drop in rectifier 70, the output of integrator 72 would be approximately 1.1 volt for a high state. This level is converted up to a typical logical high state of approximately 3.6 volts by comparator 74. A +0.8 volt is applied to the inverting input of comparator 74 to provide some finite reference level which provides noise discrimination; and thus when the output of integrator 72 is below 0.8 volt, the output of comparator 74 would be near zero or a logical low signal. In any event, with greater than +0.8 volt on the positive input of comparator 74 and a +0.8 volt on the inverting input, the output of comparator 74 will be high.

A similar arrangement is employed to determine when the probe input signal falls below +0.8 volt, this being accomplished by low threshold comparator 52 to which the input signal and +0.8 volt are fed. Low threshold comparator 52 is conventional and simply provides as an output a high logical output, approximately 3.6 volts, on terminal 76 when the level of the input signal falls below 0.8 volt and an approximately 0 volt output when it is not. The output of low threshold comparator 52 is fed through rectifier 78 and integrator 80, which are identical with rectifier 70 and integrator 72, and function in the same manner. The output of integrator 80 is fed to the non-inverting input of comparator 82 together with a reference +0.8 volt on the inverting input, and comparator 82 provides a logic state output, approximately 3.6 volts, when, subject to the time constant of integrator 80, the probe input signal remains below 0.8 volt for 50% or more of the cycle of the input signal as described.

Comparator 82 provides a high, approximately 3.6 volts, output when input below the 0.8 volt state exists for at least 50% of the signal cycle and a 0 output when the signal does not fall below 0.8 volt for at least 50% of the cycle of the input signal. Thus, by the circuitry thus far described, there has been developed two logic signals which indicate whether the logic signal is properly transitioning to a high state and low state during its cycle. The circuitry will not absolutely determine that the transitions are occurring, that is, there may be a high output of high threshold comparator 50 if the signal is simply holding at a high state. Similarly, low threshold detector 52 does not really determine movement to a low state. It would provide a high output if the low state remains on continuously.

In order to determine transitioning, upward and downward, two additional logic signal states are developed. The function of the first one is to determine transistioning of the signal through the high, 2.6 volts, threshold state, and it involves the detection of transitioning of the output signal of high threshold comparator 50. To accomplish this, this output signal is fed to one-shot 84 which provides an output pulse of one-hundredth of a second, having the same time constant as integrators 72 and 88, whenever there is a signal transition in one direction through the 2.6 volts threshold. Thus, even if there occurs a single transistion of, say, a 1 microsecond pulse, this transistion will be detected and held for a sufficient period of time to be a discernable signal when read out by L.E.D. display 54, as will be further described. The output of one-shot 84 is fed through a rectifier 86 and an integrator 88 just as in the case of the direct output from high threshold comparator 50. Thus, there is provided at the output of integrator 88 a 1.1 volt level evidencing transitioning, or a zero level if such is not occurring, and this signal is applied to the non-inverting input of comparator 90 together with the +0.8 reference volt input applied to the inverting input of comparator 90. Thus, in the case of transitioning through the +2.6 level, the output of comparator 90 will be at a high state during such and at a low state when such is not occurring.

Similarly, transitioning through the low threshold level of 0.8 volt is detected, in this case by one-shot 92, which provides a one-hundredth second high state, 3.6 volts, output for one-hundredth of a second when such transitioning occurs. This signal is fed through rectifier 94 and integrator 96 identical with the other rectifier-integrator combination thus far described. Then the output of integrator 96 is fed to the non-inverting input of comparator 97 together with a 0.8 volt reference, and thus comparator 97 provides a high state output when transitioning through the lower reference state occurs at terminal 48 and otherwise is at a low state. By the means described, signal processor 62 provides four logic signals on terminals 98, 100, 102, and 104. To review them, there will appear on terminal 98 a high logic state when the input signal remains high for at least 50% of the logic cycle, and a low state when it does not. A high logic state appears on terminal 104 when the input signal is low for at least 50% of the cycle of the input signal and a low state when it does not.

Thus, in the case of a perfect square wave, terminals 98 and 104 would remain high. The output on terminal 100 will be high as the input signal transitions through the upper threshold level. Finally, the signal level on terminal 102 will be high as the signal transitions through the lower threshold level.

It is a particular feature of this invention that these four logical outputs can be employed to generate a series of patterns on a matrix type display which readily indicate to an observer the condition of the signal being observed. This is accomplished by display circuitry 64. In it, 5×7 L.E.D. matrix display 54 is driven by a Y coordinate programmable memory, or prom, 106, and the X coordinates are driven by prom 108. Prom 106 is addressed by the combination of outputs from a three bits recycling count from counter 110, the logic state outputs from terminals 98, 100, 102, and 104 and mercury switch 112. The three lowest orders of bits of the prom, $A_1$, $A_2$, and $A_3$, are addressed by the three bits outputs from counter 110, and the next four higher order bits of the address, $A_4$, $A_5$, $A_6$, and $A_7$, are addressed in that order by outputs from output terminals 98, 100, 102, and 104, respectively. Address bit $A_8$ is obtained from mercury switch 112, which is connected via current limiting resistor 113 to +5 volts at terminal 27. This provides a low state when analyzer 10 is tilted to the right as shown in solid lines in FIG. 1 and provides a high state when tilted to the left as shown in dashed lines. The seven bit output for each address of prom 106 provides one set of the Y coordinate power leads, $Y_1$-$Y_7$, for L.E.D. display 54. Prom 106 is arranged such that, when desired, and as dictated by the memory, a particular coordinate of display 54 will be on, this being provided by a corresponding bit of the memory being a 0. This in effect provides a ground for a column of L.E.D.s and the L.E.D. in that column to be lit as determined by the application of an energizing row signal, by one or more of row input leads $X_1$-$X_5$ from prom 108.

Prom 108 employs five bytes or words of memory, each encoded to provide a high state on one of leads $X_1$-$X_5$ as it is progressively addressed by the three bits count of counter 110 and responsive to counter 110. Thus, it is to be noted that in order, the $X_1$ row of L.E.D. matrix display 54 is first energized, then in order, the $X_2$-$X_5$ rows are energized. It is to be noted that the output leads from prom 108 to matrix display 54 are coupled to pull up resistors $R_1$-$R_5$ and that, in operation, the level on one of these lines is brought up from 0 to a high state by a 1 bit appearing on that lead.

Counter 110 is driven by a conventional clock oscillator 111 powered by +5 volts from terminal 27. In a like manner, counter 110, prom 106, and prom 108 are driven from +5 volts terminal 27.

Referring to FIGS. 3a-3k, there are shown 11 display patterns which are generated by display circuitry 64. Actually, those shown correspond to those that will appear with the tester employed in a right-hand posture as shown in solid lines in FIG. 1. The display unit also generates the inverse of these when the tester is moved to the left-hand observing position as shown by dashed lines in FIG. 1 as effected by mercury switch 112 being oriented perpendicular to probe major axis. Thus, there are two sets of display data for each of the patterns of intelligence. For each pattern, there are five seven-bit bytes or words of data which may vary, these providing column (Y) inputs for each of $X_1$-$X_5$ rows of the display. Thus, there are five bytes or memory locations for each display mode, and there are 11 of 22 possible display modes for counting left-hand and right-hand states, and thus 110 memory locations or addresses are employed.

To examine the operation of display circuitry 64, it will be first assumed that probe 10 is not in engagement with a circuit making a D.C. connection through to either a ground state of the circuit under test or a high state or that the voltage is in a steady state in between the threshold levels. Under this condition, four terminals, 98, 100, 102, and 104, are at a low state. Thus, address leads $A_4$-$A_7$ are all at a 0 bit state, and we will assume that for right-hand operation, switch 112 is conducting and bit 8 is therefore unenergized. The low order address bits $A_1$-$A_3$ will be addressed by counter 110 as it counts and will cycle through the addresses of the first five memory locations of prom 108, with the memory addresses of both proms 108 and 106 and output data being as shown in Table A as follows:

TABLE A

Condition: D.C. not connected or between thresholds

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 00 | FF |
| 1 | 2 | 01 | FF |
| 2 | 4 | 02 | 80 |
| 3 | 8 | 03 | FF |
| 4 | 10 | 04 | FF |

It will be noted that the first address 00 of prom 106 has stored an FF which produces all ones for leads on $Y_1$-$Y_7$. The result will be that none of the L.E.D.s in this $X_1$ row will be illuminated. Similarly, for address 01, there is an FF and row $X_2$ will be blank. At address 02, row $X_3$, however, the data in prom 106 is 80 which will produce all zero output states of prom 106; and with a 0 on the output lines $Y_1$-$Y_7$ corresponding to the $X_3$, the center row of matrix display 54, this row will be illuminated as shown in FIG. 3a. Next, at the following addresses, 03 and 04, the data will be FF in both cases which will provide all ones, and thus rows $X_4$ and $X_5$ are both unlit or blank.

Next, it will be assumed that the voltage is finite but below 0.8 volt and there is no transitioning through either the high threshold state or low threshold state. Thus, under this condition, the output on terminal 104 is high and on the other three terminals it is low. Thus, of the high order bit inputs of prom 106, bit $A_4$ is high and bits $A_5$, $A_6$, $A_7$, and $A_8$ are low. Keep in mind that the $A_8$ is always low when the logic tester is in a right-hand posture. With reference to FIG. 3b, reference is made additionally to the following Table B:

TABLE B

Condition: D.C. low and no transitioning (right hand)

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 08 | 00 |
| 1 | 2 | 09 | FF |
| 2 | 4 | 0A | FF |
| 3 | 8 | 0B | FF |
| 4 | 10 | 0C | FF |

It will be noted from Table B that the next set of hex encoded addresses are 08-OC of prom 106. For convenience, only the first five of each sequential set of eight addresses is employed. Of each sequential set of addresses 08-OC, it is to be noted that the time of addressing of address 08 corresponds to the time of addressing row $X_1$ (counter 110 has recycled and is starting over). The data at address 08 is 00 which corresponds to an all zero output on lines $Y_1$-$Y_7$ on prom 106 and which a one on row $X_1$, row $X_1$ is illuminated as shown in FIG. 3b. All other addresses in prom 106 are addressed in the next four counts of counter 110 and display an FF, which is all ones, and which could mean that none of the other elements of the matrix of the display would be illuminated during this cycle of counts. By displaying a lighted row below the threshold, FIG. 3b clearly conveys the idea that we have a continuous D.C. state, below 0.8 volt.

Referring to FIG. 3c, the condition depicted is one wherein the signal is not above the upper threshold for at least 50% of the time and, in fact, is not transitioning through the upper threshold. It does, however, at least occasionally pass through the lower threshold, that is, it crosses the lower threshold but does not spend at least 50% of its time below the lower threshold. This condition is designated by a low state on terminal 98, a low state on terminal 100, a high state on terminal 102, and a low state on terminal 104. The hex address and data at that address in prom 106 is shown in Table C as follows:

TABLE C

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 10 | B8 |
| 1 | 2 | 11 | BA |
| 2 | 4 | 12 | 02 |
| 3 | 8 | 13 | FF |
| 4 | 10 | 14 | FF |

FIG. 3d illustrates a signal condition wherein the signal under test is downshifted, that is, it does not rise above the upper threshold but it does go below the lower threshold, and for at least 50% of the signal pulse cycle. This waveform results from terminals 98 and 100 being low and terminals 102 and 104 being high. Signal addressing to effect this waveform is shown in the following table:

TABLE D

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 18 | 06 |
| 1 | 2 | 19 | B6 |
| 2 | 4 | 1A | B0 |
| 3 | 8 | 1B | FF |
| 4 | 10 | 1C | FF |

Next, FIG. 3e illustrates the condition wherein the input pulse signal is upshifted, that is, where the signal does not cross the lower threshold and does go above the upper threshold but for less than 50% of the cycle of the signal. To produce this waveform, terminal 98 would be low, terminal 100 would be high, terminal 102 would be low, and terminal 104 would be low. Table E, which follows, illustrates the address and data pattern to produce FIG. 3e.

TABLE E

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 20 | FF |
| 1 | 2 | 21 | FF |
| 2 | 4 | 22 | 02 |
| 3 | 8 | 23 | BA |
| 4 | 10 | 24 | B8 |

FIG. 3f illustrates the condition where the input signal does go above and below the upper thresholds but does not transition properly. The evidence of this state is that terminal 98 is low, terminals 100 and 102 are high, and terminal 104 is low. The following Table F illustrates the address-data combinations to produce FIG. 3f.

TABLE F

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 30 | F8 |
| 1 | 2 | 31 | BA |
| 2 | 4 | 32 | A2 |
| 3 | 8 | 34 | AE |
| 4 | 10 | 35 | 0F |

FIG. 3g is illustrative of the state wherein there is only a proper low duty cycle pulse. It is produced by terminal 98 being low, terminal 100 being high, and terminals 102 and 104 being high. The follow Table G is illustrative of the address-data combination to produce the waveform shown in FIG. 3g.

TABLE G

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 38 | 02 |
| 1 | 2 | 39 | BA |
| 2 | 4 | 3A | BA |
| 3 | 8 | 3B | BA |
| 4 | 10 | 3C | B8 |

FIG. 3h is illustrative of the state wherein the input signal is high for more than 50% of the duty cycle and does not cross either threshold level. It is produced by terminal 98 being high while terminals 100, 102, and 104 are all low. The address-data combinations to produce this waveform is shown in the following Table H.

TABLE H

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 40 | FF |
| 1 | 2 | 41 | FF |
| 2 | 4 | 42 | FF |
| 3 | 8 | 43 | FF |
| 4 | 10 | 44 | 00 |

FIG. 3i is illustrative of the condition wherein the input signal goes above the upper threshold for at least 50% of the cycle and properly cycles through this state but does not go below or properly cycle through the lower threshold. To produce this waveform, terminal 98 would be high, terminal 100 would be high, and terminals 102 and 104 would be low. The address-data combinations for producing this waveform are illustrated in the following Table I.

TABLE I

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 60 | FF |
| 1 | 2 | 61 | FF |
| 2 | 4 | 62 | B0 |
| 3 | 8 | 63 | B6 |
| 4 | 10 | 64 | 06 |

FIG. 3j illustrates the condition wherein there is a proper high duty cycle. To produce this waveform, terminal 98 would be high, terminal 100 would be high, terminal 102 would be high, and terminal 104 would be low. The address-data combinations for producing this waveform are illustrated in the following Table J.

TABLE J

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 70 | B8 |
| 1 | 2 | 71 | BA |
| 2 | 4 | 72 | BA |
| 3 | 8 | 73 | BA |
| 4 | 10 | 74 | 02 |

Finally, in the right-hand sequence, FIG. 3k illustrates a proper square wave. To produce it, all four of terminals 98–104 would be high. The address-data combinations necessary to produce this waveform are illustrated in the following Table K.

TABLE K

| Prom 108 | | Prom 106 | |
|---|---|---|---|
| Binary Address | Binary Data (leads $X_1$-$X_5$) | Hex Address | Hex Data (leads $Y_1$-$Y_7$) |
| 0 | 1 | 78 | B0 |
| 1 | 2 | 79 | B6 |
| 2 | 4 | 7A | B6 |
| 3 | 8 | 7B | B6 |
| 4 | 10 | 7C | B6 |

In instances where analyzer 10 is shifted from a right-hand viewing position as shown in solid lines in FIG. 1 to a left-hand position as shown in dashed lines, waveforms are converted from those shown in FIGS. 3a–3k so that the viewer will actually see the same configuration that he would have seen had the analyzer been in the right-hand viewing position. In order to accomplish this, a new set of data for each set of waveforms will be depicted as required which effects the necessary pictorial inversion. This involves five new memory locations for each figure for an additional total of 55. The new selection is accomplished by means of mercury switch 112 which is closed in the right-hand position and opened in the left-hand position. When open, it provides a continuous high state in the bit 8 input to prom 106, thus enabling the identification of the new 55 memory locations which are required. Encoding of a memory address for prom 106 for a particular row of display 54 is effected in the same manner as earlier described wherein a 0 bit is provided for a column in instances where an incremental block 116 of the display is to be illuminated; otherwise, this bit would be a 1 or high.

From the foregoing, it is believed clear that the applicant has provided a substantially improved logic analyzer. By it, the user can very rapidly determine the status of a logic signal at a discrete point in a circuit. The display analyzer does not require adjustment during use and clearly unambiguously illustrates 1 of 11 most likely conditions to be found. Significantly, it enables the detection of only a single variant condition, such as the occurrence of a single faulty transition, which in itself might occupy only one microsecond or so. It requires few components and thus is simple and inexpensive to manufacture.

What is claimed is:

1. A logic circuit tester comprising:

sampling means for making electrical contacts across a logic circuit and providing a signal output representative of the logic signal present;

first circuit means responsive to said signal output for providing one selected signal state as a first discrete electrical output within a selected period when said signal output is representative of a logic signal which is above a selected upper threshold level for at least a selected percentage of the cycle of said logic signal, and a different signal state within said selected period when said signal output is not above said upper threshold level for a said selected percentage of the said cycle of said logic signal;

second circuit means responsive to said signal output for providing one selected signal state within said selected period as a second discrete electrical output upon the logic signal passing through said selected upper threshold level in a said cycle, and a different signal state within said selected period when said logic signal does not pass through said selected upper threshold level in a said cycle;

third circuit means responsive to said signal output for providing one selected signal state as a third discrete electrical output within said selected period when said signal output is representative of a logic signal which is lower than a selected lower threshold level, which lower threshold level is lower than said upper threshold level, for at least a selected percentage of the cycle of said logic signal, and a different signal state within said selected period when said logic signal is not lower than said selected lower threshold level for at least a selected percentage of the cycle of said logic signal;

fourth circuit means responsive to said signal output for providing one selected signal state as a fourth discrete electrical output within a selected period upon the occurrence in a logic cycle of the logic signal passing through said lower threshold level, and a different signal state within said selected period when said logic signal does not pass through said lower threshold level during a logic cycle; and output means responsive to simultaneous said first, second, third, and fourth discrete electrical outputs for electrically combining said electrical signal outputs and distinctively indicating the discrete occurrence of each of a plurality of different combinations of signal states of said first, second, third, and fourth outputs.

2. A logic circuit tester as set forth in claim 1 wherein said output means comprises display means for providing a visual presentation.

3. A logic circuit tester as set forth in claim 2 wherein said second and fourth circuit means are responsive to a said signal passing through a said threshold for providing a said one signal state for a period exceeding a cycle of said logic signal, and whereby said display means is enabled to provide a longer time display of such event that the time of its occurrence.

4. A logic circuit tester as set forth in claim 3 wherein said selected percentage is approximately 50%.

5. A logic circuit tester as set forth in claim 4 wherein said display means comprises a matrix of X by Y light sources having X and Y line inputs and includes logic means responsive to said first, second, third, and fourth outputs for selectively energizing discrete said light sources for forming discrete light patterns.

6. A logic circuit tester as set forth in claim 5 wherein said logic means comprises:

counting means for providing a recycling count of up to at least X;

drive means responsive to said counting means for sequentially, and on a recycling basis, providing a first electrical input to each X line of said matrix of light sources; and memory means responsive to said first, second, third, and fourth outputs and said recycling count for selectively providing a second potential to discrete light sources in a selected Y line of said matrix of light sources;

whereby said discrete light patterns are formed.

7. A logic circuit tester as set forth in claim 6 wherein:

said tester includes an elongated housing enclosing said circuit means and said display, said housing having an opening through which said display is viewable, with the X lines of said matrix of light sources being generally parallel with the longitudinal dimension of said housing;

said sampling means includes an electrical probe extending from one end of said housing; and said logic means includes position responsive switching means for inverting said patterns as a function of the orientation of said housing wherein, when said housing is being held generally with said probe to the left of a viewer, said pattern will appear the same as when said probe is being held with said pattern to the right of a viewer.

* * * * *